US006630074B1

(12) United States Patent
Rath et al.

(10) Patent No.: US 6,630,074 B1
(45) Date of Patent: Oct. 7, 2003

(54) ETCHING COMPOSITION AND USE THEREOF

(75) Inventors: David Lee Rath, Stormville, NY (US); Ravikumar Ramachandran, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 630 days.

(21) Appl. No.: 09/137,179

(22) Filed: Aug. 20, 1998

Related U.S. Application Data

(63) Continuation-in-part of application No. 08/975,755, filed on Nov. 21, 1997, which is a continuation-in-part of application No. 08/832,999, filed on Apr. 4, 1997, now Pat. No. 5,780,363.

(51) Int. Cl.[7] .................. C09K 13/08; C09K 13/04; C09K 13/00
(52) U.S. Cl. ................. 252/79.3; 252/79.2; 252/79.1
(58) Field of Search .............. 252/79.3, 79.2, 252/79.1, 79.4; 438/745, 906, 963; 134/1.3, 2, 3, 902; 216/92, 99, 96, 100

(56) References Cited

U.S. PATENT DOCUMENTS 5,082,518 A * 1/1992 Molinaro .................. 156/345

FOREIGN PATENT DOCUMENTS

WO     WO 97/36209     * 10/1997

OTHER PUBLICATIONS

English translation of TW 296405.*
DERWENT English language abstract of TW 296405A.*

* cited by examiner

*Primary Examiner*—Cheryl A. Juska
(74) *Attorney, Agent, or Firm*—Tiffany L. Townsend

(57) ABSTRACT

An aqueous etchant composition containing about 0.01 to about 15 percent by weight of sulfuric acid and about 0.01 to about 20 percent by weight of hydrogen peroxide or about 1 to 30 ppm of ozone, and about 0.01 to 100 ppm of hydrofluoric acid is effective in removing polymer and via residue from a substrate or conductive material, and especially from an integrated circuit chip having aluminum lines thereon.

7 Claims, 2 Drawing Sheets

ETCHING COMPOSITION AND USE THEREOF

RELATED APPLICATIONS

This application is a continuation in part of U.S. patent application Ser. No. 08/975,755 filed on Nov. 21, 1997 entitled "Etching Composition and Use thereof", assigned to the present assignee, which is a continuation in part of U.S. patent application Ser. No. 08/832,999 filed on Apr. 4, 1997, now U.S. Pat. No. 5,780,363, entitled "Etching Composition and Use Thereof", assigned to the present assignee and both of which are incorporated by reference in their entirety.

TECHNICAL FIELD

The present invention is concerned with an etchant composition and especially with a composition that is capable of removing inorganic polymer residue present on a substrate due to a previous metal reactive ion etching process. In addition, the present invention is directed to a method for removing such polymer residue by employing the etchant compositions of the present invention.

BACKGROUND OF THE INVENTION

Aluminum and aluminum alloys are frequently used for the "metallizations" in large scale integrated circuits. The aluminum alloys include those with small amounts of copper for reducing the potential for electromigration effects, where current applied to the device induces transport of the aluminum atoms. Small amounts of silicon or titanium have been added to aluminum in order to minimize the possibility of electrical spiking that can occur in contact holes.

In order to form the patterned metallization, a series of process steps are carried out. These include depositing a layer containing aluminum, coating a photoresist film onto the aluminum containing layer, creating in the photoresist film an image of the predetermined required pattern, such as by exposing selected portions of the photoresist film to light passing through a mask or grating, and then removing either the exposed or unexposed portions of the photoresist film, depending upon the type of resist employed, and finally removing the aluminum or aluminum alloy layer in the regions not masked by the remaining photoresist film. Next, the remaining photoresist film can be removed.

More particularly, aluminum/copper metal line for BEOL wiring/interconnect in semiconductor devices are currently delineated by a reactive ion etching process. Such a process involves patterning the aluminum/copper metal layer with a photoresist and then reactive ion etching (RIE) in a chlorine environment using boron trichloride, HCl gas, $Cl_2$ or any other chlorine containing reactive species in order to etch away the exposed aluminum/copper layer. However, such etching process leaves a residue around the metal lines which consist of complex polymeric oxides of aluminum along with incorporating chlorine into the inorganic matrix. This is typically referred to as sidewall polymer residue, and its presence is a troublesome source of corrosion of the Al/Cu lines when exposed to the environment such as atmospheric air and/or humidity. Moreover, trace amounts of chlorine over time break down the passivating layer of aluminum oxide and corrode the underlying aluminum. Traditionally, the use of fluoride containing compounds in general, and hydrofluoric acid in particular, has been avoided because it has the tendency to degrade the quality of metal lines in general, and aluminum in particular.

Additionally, after a RIE process, sidewall polymers remain on the semiconductor wafer surface. These sidewall polymers, known as "polymer rails" are inorganic in nature and have various chemical constituents, including aluminum, silicon, titanium, oxygen, carbon and chlorine. Since each of there constituents tend to react and/or interfere with the semiconductor wafer function, removal of the sidewall polymers is therefore desirable. A post metal RIE cleaning step is presently done using a chromic/phosphoric acid etch, or solvent based chemistry methods. However, one common chemical constituent with a solvent based chemistry is an amine which can cause problems with certain types of photoresists. Solutions which are based on diluted sulfuric acid and hydrogen peroxide mixtures have been introduced in an attempt to remove polymer rails. However, these methods have not been successful in removing all types of polymer rails. For example, as shown in FIG. 1, in regions where there is an isolated metal pad which has a metal line density lower than the array region of the semiconductor chip and a surrounding region which is predominantly silicon oxide, current methods are less than completely successful. FIG. 1 illustrates a situation where the use solution of the present invention would be indicated. In FIG. 1, a wafer is shown after it has undergone a RIE process. The direction of the RIE process is shown by the arrow. The structure shown, 10, can be comprised of multiple layers. For example, there can be an oxide layer, 11, and a conductive layer, 12. The RIE process selectively removed portions of the conductive layer to expose the oxide layer. Accordingly, there is little to no residual left on the surface, 5, of the oxide, 11. The RIE process was, in this case, directed at the surface, 5, as shown by the arrow. However, the structure, 10, may contain a solid film, 15, covering the sidewalls, 13 and the top, 14, of the structure, 10.

Alternatively, as shown in FIG. 2, the etchant is useful for processing steps not involving polymer etching. For example, there could be regions in an oxide layer, where a via, 25, has been previously formed and filled. Preferably the material filling the via, 25, would be a conductive material. The via may provide electrical communication between different levels of the wafer. The etchant solution of the instant invention would also be useful for cleaning the via, 20, which is opened to the via, 25, of many types of residue material. Residue materials include, but are not limited to oxygen, silicon, carbon and elements of an underlying conductive layer.

Accordingly, methods are suggested for removing this sidewall polymer residue and polymer rails. One of the more popular method employs a chromic/phosphoric acid bath. However, this procedure is only marginally effective. Moreover, the chromic/phosphoric acid bath tends to cause some electrochemical etching of aluminum, especially near tungsten studs, which are typically present, thereby causing degradation of the aluminum metal layer.

Accordingly, providing an etching process capable of removing the sidewall polymer and via residue that does not etch conductive materials, especially aluminum, to any undesired extent, while removing the sidewall polymer residue would be desirable.

BRIEF DESCRIPTION OF THE DRAWINGS

These and other features, aspects, and advantages will be more readily apparent and better understood from the following detailed description of the invention, in which.

SUMMARY OF INVENTION

Figure 1:
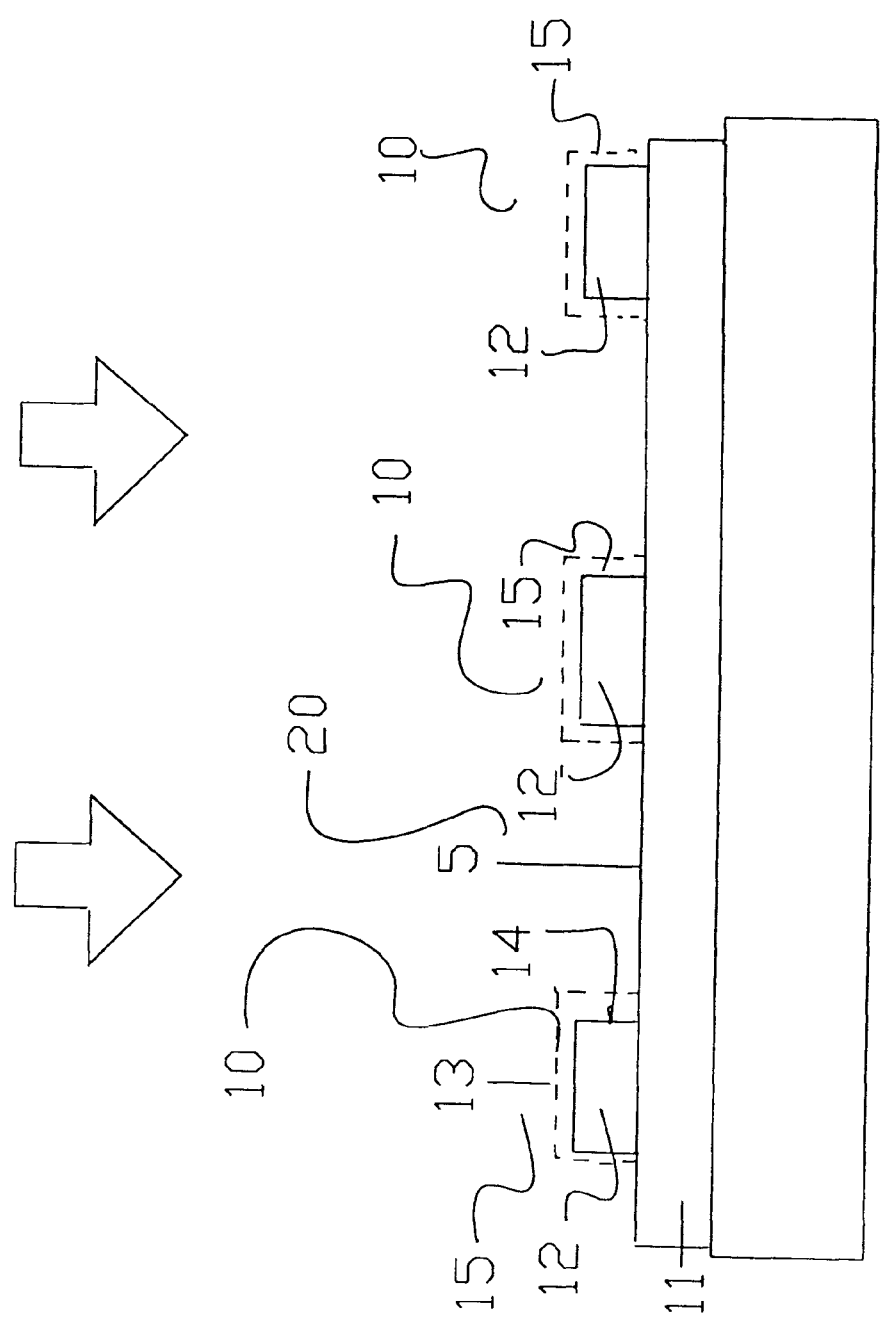
FIG. 1 is a cross-sectional view of a portion of a semiconductor device illustrating a problem the instant invention is seeking to solve.
Figure 2:
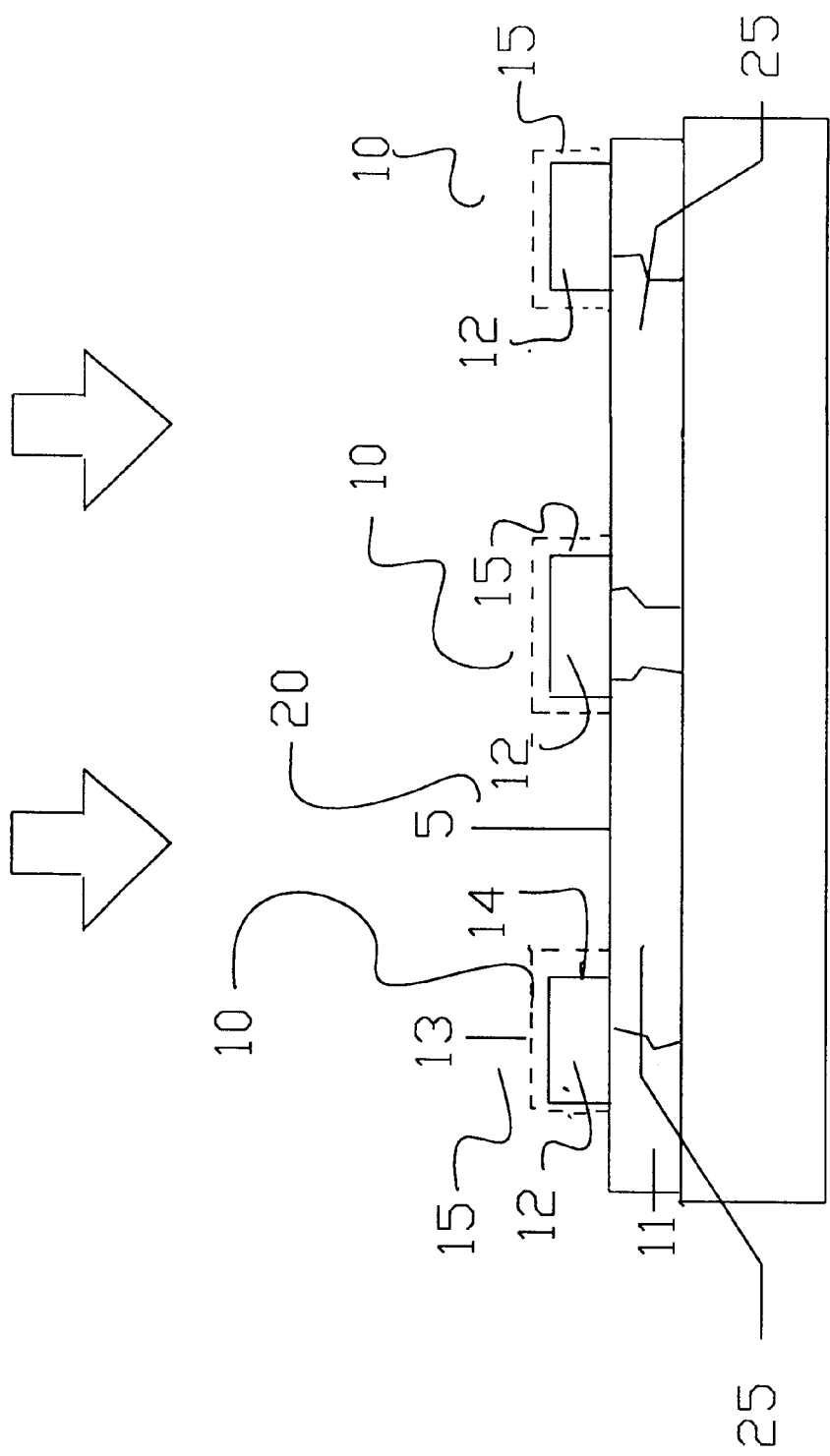
FIG. 2 is a cross-sectional view of a portion of a semiconductor device illustrating a problem the instant invention is seeking to solve.

The present invention provides an etchant composition that is capable of removing via residue and does not adversely effect the aluminum lines or lines made of other conductive materials. Moreover, the etching composition of the present invention is quite acceptable from an environmental point of view. Additionally, the etchant composition is particularly useful in removing inorganic polymers attached to the metal lines in isolated regions where there may be a higher silicon concentration as compared to the array regions.

The etchant composition of the present invention is an aqueous solution containing about 0.01 to about 15 percent by weight of sulfuric acid, about 0.01 to about 20 percent by weight of hydrogen peroxide, or about 1 to about 30 ppm of ozone, and about 0.1 to about 100 ppm of hydrofluoric acid.

Another aspect of the present invention is concerned with removing polymer and via residue from a substrate which comprises contacting the substrate with an aqueous solution containing about 0.01 to about 15 percent by weight of sulfuric acid, and about 0.01 to about 20 percent by weight of hydrogen peroxide, or about 1 to about 30 ppm of ozone.

Still other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the description is to be regarded as illustrative in nature and not as restrictive.

Best and Various Modes for Carrying Out Invention

The etchant compositions of the present invention are aqueous solutions containing about 0.01 to about 15 percent by weight and preferably about 1 to about 10 percent by weight of sulfuric acid and about 0.01 to about 20 percent by weight of hydrogen peroxide, 0.1 to about 100 ppm of hydrofluoric acid and preferably about 1 to about 10 percent by weight of hydrogen peroxide or about 1 to about 30 ppm and preferably about 5 to about 20 ppm of ozone with the balance being substantially water, and more preferably contain about 0.1 to about 100 ppm of a fluoride containing compound, preferably hydrofluoric acid. It is not necessary that the fluoride containing compound be hydrofluoric acid. It is necessary that the fluoride containing compound contribute free fluoride to the etchant composition. It is preferred that the fluoride containing compound be able to contribute the equivalent of at least about 8 and at most about 12 ppm of hydrofluoric acid to the etchant solution. A preferred composition of the present invention is an aqueous solution of about 8 percent by weight of sulfuric acid, and about 1.5 percent by weight of hydrogen peroxide and the remainder being substantially water, and more preferably contain about 10 ppm of a fluoride containing compound, preferably hydrofluoric acid. This composition is preferably employed at temperatures of about 35° C. Another more preferred composition of the present invention is an aqueous solution of about 9 percent by weight sulfuric acid and about 4 percent by weight hydrogen peroxide and the remainder being substantially water, and more preferably contain about 10 ppm of a fluoride containing compound, preferably hydrofluoric acid. This composition is preferably employed at temperatures of about 35° C. and is especially preferred for removing thicker and more tenacious sidewall polymer. Yet another more preferred composition of the present invention is an aqueous solution of about 5% by weight of sulfuric acid, about 12% by weight of hydrogen peroxide and about 10 ppm hydrogen fluoride. The water employed is preferably deionized water.

These etchant compositions of the present invention can be prepared by admixing an aqueous sulfuric acid such as a 98 percent by weight solution with an aqueous solution of hydrogen peroxide such as a 30 percent by weight solution and aqueous hydrofluoric acid such as 49 percent by weight and adding these solutions to water in an amount to provide the desired percentage of the sulfuric acid, hydrogen peroxide, and hydrofluoric acid.

The compositions containing the ozone can be prepared by bubbling ozone gas into the aqueous composition containing the desired amounts of sulfuric acid and water, or diffusing ozone gas through a membrane into water and then adding sulfuric acid to the water, or by any other suitable method.

The etchant compositions of the present invention remove the sidewall polymer residue remaining after the reactive ion etching and with it removes any embedded chlorine. The etchant compositions of the present invention also clean vias of other residues, including, but not limited to, oxygen, carbon, silicon and elements of an underlying conductive material. Furthermore, the etchant compositions of the present invention, at most, only mildly etch the aluminum/copper line. Since hydrofluoric acid is known to etch aluminum/copper, the amounts in the etchant solution must be small. When the amounts of hydrofluoric acid in the claimed etchant solution are kept small (less than about 40 ppm) the potentially detrimental effects of the hydrofluoric acid on aluminum/copper are minimized. In most cases, no evidence of any local etching of the aluminum, even aluminum in the vicinity of tungsten studs, has been observed. The tungsten seems to act as a catalyst in etching aluminum when using the prior art chromic/phosphoric acid bath. They also can be used to remove and clean residues after chemical-mechanical polishing and other 'cleaning' processing steps.

The etchant compositions of the present invention also result in the formation of a pristine native oxide of aluminum which acts as a passivating layer against subsequent corrosion. For instance, an oxide thickness of about 30 angstroms as measured by Auger Spectroscopy is obtained using an etchant composition at about 35° C. containing about 2.0 percent by weight of sulfuric acid, about 1.0 percent by weight of hydrogen peroxide and about 10 ppm of hydrofluoric acid.

The above disclosed-relative amounts of components of the composition tend to prevent redeposition of the polymer residue. This occurs by having the pH of the etchant such that the charges of the zeta potentials of the aluminum oxide species and the silicon oxide surface of the substrate cause a repulsion interaction between the surfaces. The desired pH is ensured by observing the amounts of ingredients mentioned above. The zeta potential reflects the charge induced on a surface caused by the interactions of that surface with the ions in the solution, primarily, hydrogen and hydroxide. At a certain solution pH, the net surface charge will be zero which occurs at about pH 2 to 3 for silica and at about pH 9 to 10 for alumina. When the pH is less than this point of zero charge, the charge on the surface would be positive. For the case of a polymer residue removed in an acid medium, the propensity of redeposition of the residue on either the oxidized aluminum surface or on the silica dielectric material is reduced because all surfaces would have a charge of the same sign with zeta potentials also of the same sign. It should be noted that HF acid in the concentrations employed in the present invention (less than about 100 ppm) do not result in significant changes in the pH of the resulting etchant solution.

The etchants of the present invention can be used to contact the substrate where the polymer or via residue is to be removed by any known technique, such as dipping in a bath or preferably spraying the composition on the substrate or silicon wafer having the aluminum copper lines thereon. Typically, the composition is sprayed at a temperature of about 25 to about 95° C. and preferably at a temperature of about 30 to about 50° C. for about 1 to about 8 minutes, typical of which is about 2 minutes. Following this, the wafer can be subjected to a deionized water rinse followed by drying.

The process of the present invention is also capable of removing chlorine embedded material along with the aluminum/copper sidewall polymer residue. The aluminum/copper profiles achieved by the present invention can be smoother than those in the prior art and are capable of being substantially free of electrochemical or accelerated etching of Al/Cu lines near tungsten studs.

The following Table 1 illustrates various etch rates of the Al/Cu with the etchant compositions of the present invention. The percentages in Table 1 are volume percents for 98 percent by weight $H_2SO_4$ and 30 percent by weight of $H_2O_2$ (remainder is $H_2O$).

TABLE 1

Etch rate of Al/Cu with sulfuric/peroxide
Etch rate of Al/Cu samples (Gravimetry)

| Sulfuric (percent) | Peroxide (percent) | Etch rate[1] (Angstroms/min) | Temperature ° C. |
|---|---|---|---|
| 2.5 | 2.5 | 51/116 | 35/45 |
| 2.5 | 5.0 | 57/109 | 35/45 |
| 5.0 | 2.5 | 68/148 | 35/45 |
| 5.0 | 5.0 | 59/136 | 35/45 |
| 7.5 | 5.0 | 78 | 35 |
| 7.5 | 7.5 | 77 | 35 |

[1]Etch rate increases with temperature

Table II illustrates various etch rates of the aluminum with 0.5% copper alloy with the etchant compositions of the present invention. The percentages in Table II are volume percents for 98 percent by weight $H_2SO_4$ and 30 percent by weight of $H_2O_2$ (remainder is $H_2O$).

TABLE II

Etch rate of Al/Cu with sulfuric/peroxide/hydrofluoric (gravimetry)

| HF (ppm) | Etch Rate (Angstroms/min) |
|---|---|
| 0 | 18 |
| 10 | 69 |

TABLE II-continued

Etch rate of Al/Cu with sulfuric/peroxide/hydrofluoric (gravimetry)

| HF (ppm) | Etch Rate (Angstroms/min) |
|---|---|
| 20 | 107 |
| 30 | 173 |

Etch rates were evaluated by measuring the total Al/Cu etched (gravimetry) with 30 minute process time at about 35° C. The solution employed to develop Table II comprised about 9 percent by weight of sulfuric acid, 4 percent by weight of hydrogen peroxide with hydrofluoric acid, with the addition of the amounts of hydrofluoric acid shown in the first column and with the remainder of the solution comprising water.

The percentages shown in the above in Table 1 and Table II are exemplary only and others within the scope of the invention can likewise be employed. The measured etch rates were evaluated by averaging the total amount of Al—Cu etched over the process time. In this disclosure there are shown and described only the preferred embodiments of the invention, but, as aforementioned, it is to be understood that the invention is capable of use in various combinations and environments and is capable of changes or modifications within the scope of the inventive concept as expressed herein.

What is claimed is:

1. An etchant composition in an aqueous solution comprising:
   a) about 0.01 to about 15 percent by weight of sulfuric acid;
   b) about 0.1 to about 100 ppm of a fluoride containing compound; and
   c) a member selected from the group consisting of about 0.01 to about 20 percent by weight of hydrogen peroxide and about 1 to about 30 ppm of ozone.

2. The etchant composition according to claim 1, wherein the fluoride containing compound comprises hydrofluoric acid.

3. The etchant composition of claim 1 which comprises about 0.01 to about 20 percent by weight of hydrogen peroxide.

4. The etchant composition of claim 1 which comprises about 1 to about 30 ppm of ozone.

5. The etchant composition of claim 2 which comprises about 1 to about 10 percent by weight of sulfuric acid and about 1 to about 10 percent by weight of hydrogen peroxide and about 1 to about 50 ppm of hydrofluoric acid.

6. The etchant composition of claim 2 which comprises about 5 percent by weight of sulfuric acid, about 12 percent by weight of hydrogen peroxide and about 10 ppm of hydrofluoric acid.

7. The etchant composition of claim 1 which includes deionized water.

* * * * *